United States Patent
Liaw

(10) Patent No.: US 9,496,269 B1
(45) Date of Patent: Nov. 15, 2016

(54) STATIC RANDOM ACCESS MEMORY

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/927,175

(22) Filed: Oct. 29, 2015

(51) Int. Cl.
*H01L 29/66* (2006.01)
*H01L 27/11* (2006.01)
*H01L 29/78* (2006.01)
*H01L 23/528* (2006.01)

(52) U.S. Cl.
CPC ....... *H01L 27/1104* (2013.01); *H01L 23/5286* (2013.01); *H01L 29/7851* (2013.01)

(58) Field of Classification Search
CPC ........... H01L 27/1104; H01L 27/1116; H01L 27/0886; H01L 27/0207; H01L 27/0924; H01L 27/1211; H01L 27/1108; H01L 29/6681; H01L 29/0657; H01L 27/785
USPC ....................................................... 257/390
See application file for complete search history.

(56) References Cited

U.S. PATENT DOCUMENTS

| | | | | |
|---|---|---|---|---|
| 2009/0134472 | A1* | 5/2009 | Inaba | H01L 21/84 257/390 |
| 2014/0001564 | A1* | 1/2014 | Song | G06F 17/5081 257/369 |
| 2014/0097493 | A1* | 4/2014 | Baek | H01L 27/1211 257/347 |

* cited by examiner

*Primary Examiner* — Trung Q Dang
(74) *Attorney, Agent, or Firm* — McDermott Will & Emery LLP

(57) ABSTRACT

An SRAM unit cell includes first to fourth fin structures. A first Fin FET is formed by a first gate electrode and a first fin structure. A second Fin FET is formed by a second gate electrode and the first fin structure. A third Fin FET is formed by the second gate electrode and a third fin structure. A fourth Fin FET is formed by a third gate electrode and a second fin structure. A fifth Fin FET is formed by a fourth gate electrode and the second fin structure. A sixth Fin FET is formed by the fourth gate electrode and a fourth fin structure. A first dummy fin structure is located adjacent the second Fin FET, and electrically connected to the first fin structure. A second dummy fin structure is adjacent to the fifth Fin FET, and electrically connected to the second fin structure.

20 Claims, 13 Drawing Sheets

US 9,496,269 B1

STATIC RANDOM ACCESS MEMORY

TECHNICAL FIELD

The disclosure relates to a semiconductor device, and more particularly to an SRAM (Static Random Access Memory) having FET devices.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Figure 1:
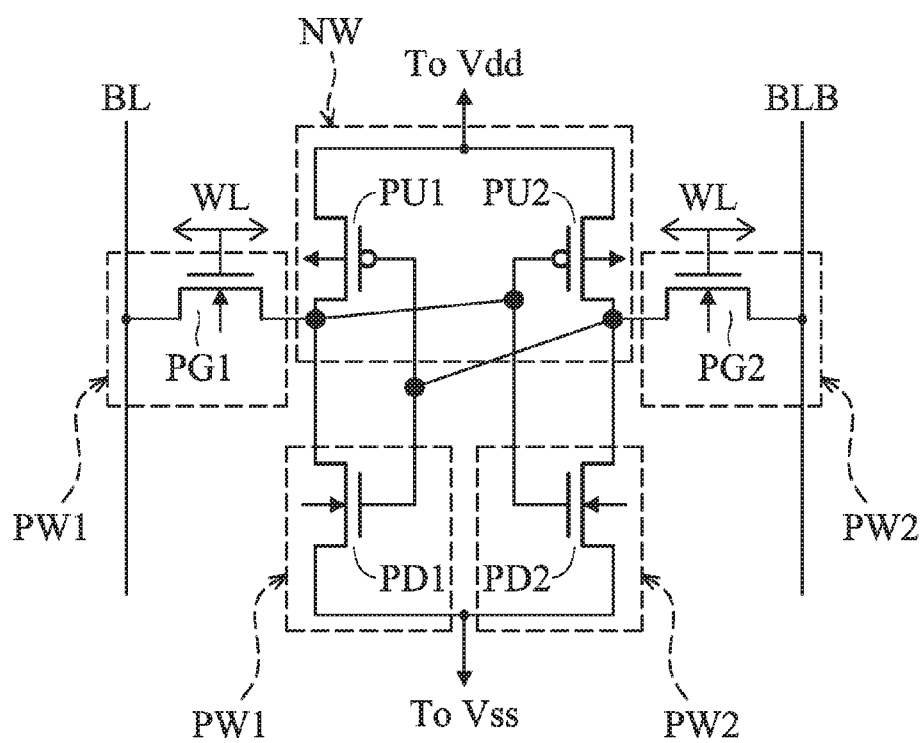
FIG. 1 is an exemplary circuit diagram of an SRAM unit cell.

FIG. 1 is an exemplary circuit diagram of an SRAM unit cell. An SRAM unit cell includes two cross-coupled inverters having a data storage node and a complementary data storage node. The output of the first inverter is coupled to the input of the second inverter, and the output of the second inverter is coupled to the input of the first inverter. The SRAM further includes a first pass-gate FET device PG1 coupled to the output of the first inverter and the input of the second inverter and a second pass-gate FET device PG2 coupled to the output of the second inverter and the input of the first inverter. Gates of the first and second pass-gate FET devices are coupled to a word line WL, a source/drain of the first pass-gate FET device PG1 is coupled to a first bit line BL, and a source/drain of the second pass-gate FET device PG2 is coupled to a second bit line BLB, which is the complement of the first bit line BL. In the present disclosure, a source and a drain of an FET device may be interchangeably used.

The first inverter includes a first first-conductive-type FET device PU1 and a first second-conductive-type FET device PD1. The second inverter includes a second first-conductive-type FET device PU2 and a second second-conductive-type FET device PD2. The first pass-gate device PG1 and the second pass-gate device PG2 are second-conductive type devices. In the first embodiment, the first conductive type is a P-type and the second conductive type is an N-type. Of course, it is possible in another embodiment that the first conductive type is an N-type and the second conductive type is a P-type, and in such a case the remaining elements in the SRAM are appropriately modified according to the common knowledge in the art.

The SRAM further includes a first P-type well PW1, a second P-type well PW2 and an N-type well NW. As shown in FIG. 1, the first pass-gate device PG1 (N-type) and the first N-type FET device PD1 are disposed within the first P-type well PW1, the second pass-gate FET device PG2 (N-type) and the second N-type FET device PD2 are disposed within the second P-type well PW2, and the first P-type FET device PU1 and the second P-type FET device PU2 are disposed within the N-type well NW.

Figure 2:
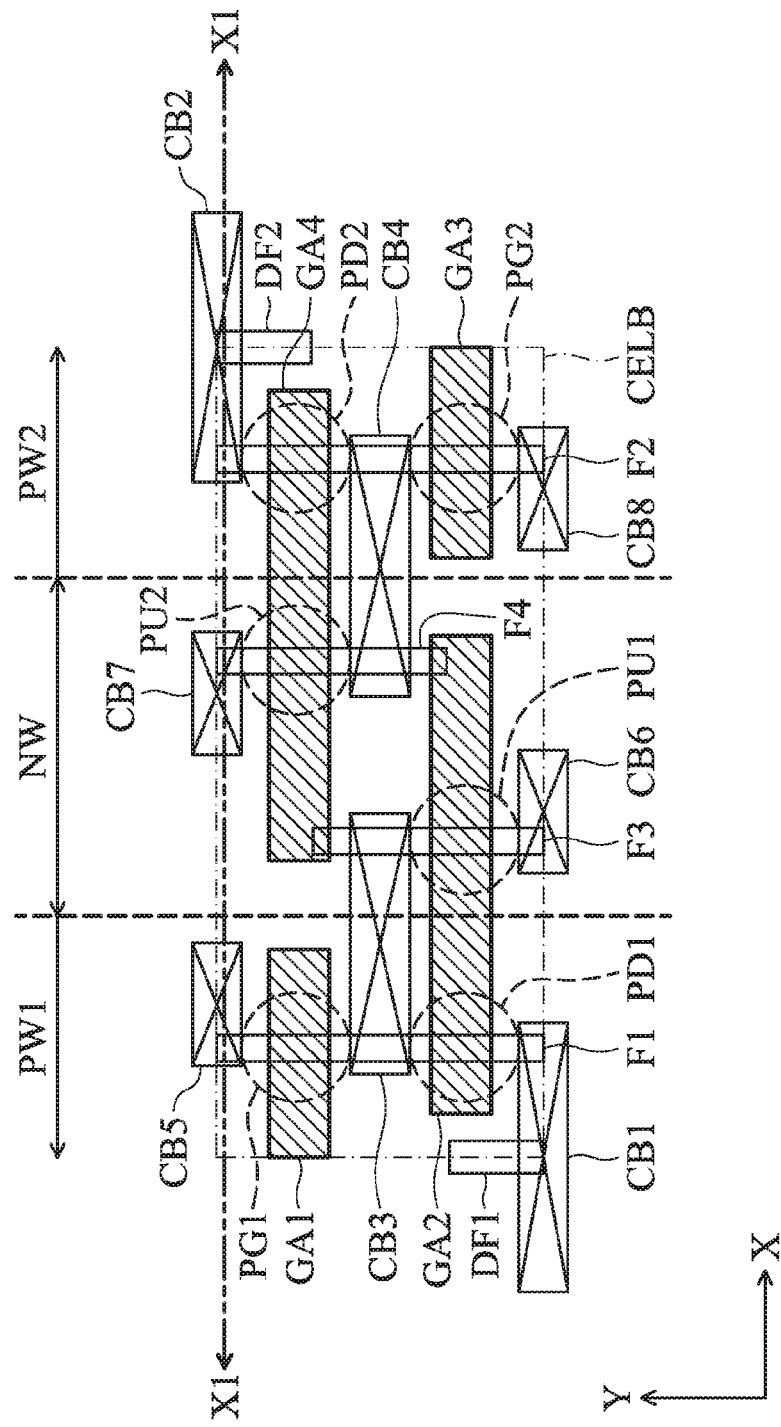
FIG. 2 is an exemplary layout of an SRAM unit cell according to a first embodiment of the present disclosure.

FIG. 2 is an exemplary layout of an SRAM unit cell according to a first embodiment of the present disclosure. In FIG. 2, only some of lower-layer elements are illustrated. The SRAM unit cell is defined by a cell boundary CELB, and includes first to fourth fin structures F1, F2, F3 and F4, each extending in the Y (column) direction and arranged in the X (row) direction. The four fin structures F1, F3, F4 and F2 are arranged in the X direction in this order. The cell boundary CELB has a bottom side extending in the X direction, a top side extending in the X direction and opposing to the bottom side, a left side extending in the Y direction and a right side extending in the Y direction and opposing to the left side.

The SRAM unit cell includes six transistors. The first pass-gate device PG1 is a fin field effect transistor (Fin FET) (PG1) formed by a first gate electrode GA1 and the first fin structure F1. The first N-type FET device PD1 is a Fin FET formed by a second gate electrode GA2 and the first fin structure F1. The first P-type FET device PU1 is a Fin FET formed by the second gate electrode GA2 and the third fin structure F3. The second pass-gate FET device PG2 is a Fin FET formed by a third gate electrode GA3 and the second fin structure F2. The second N-type FET device PD2 is a Fin FET formed by a fourth gate electrode GA4 and the second fin structure F2. The second P-type FET device PU2 is a Fin FET formed by the fourth gate electrode GA4 and the fourth fin structure F4. All of the Fin FET in the SRAM unit cell includes only one active fin structure functioning as a channel and source/drain.

The SRAM unit cell of the first embodiment further includes a first dummy fin structure DF1 located adjacent the Fin FET PD1, and a second dummy fin structure DF2 located adjacent to the Fin FET PD2. The first dummy fin structure DF1 is electrically connected to the source of the Fin FET PD1 by a first contact bar CB1. The source of the Fin FET PD1 includes a source/drain (S/D) epitaxial layer formed over the first fin structure, the dummy fin structure DF1 also includes an epitaxial layer formed over the first dummy fin structure DF1, and the first contact bar CB1 is formed over these epitaxial layers. The second dummy fin structure DF2 is electrically connected to the source of the Fin FET PD2 by a second contact bar CB2. The source of the Fin FET PD2 includes an S/D epitaxial layer formed over the second fin structure, the dummy fin structure DF2 also includes an epitaxial layer formed over the second dummy fin structure DF2, and the second contact bar CB2 is formed over these epitaxial layers. The first and second contact bars CB1 and CB2 are electrically connected to a first power supply line, for example, Vss. The S/D epitaxial layer is made of one or more layers of SiP, SiC, SiCP, Si, Ge, or a Group III-V material. The contact bars may be made of one or more layers of Cu, W, Al, AlCu, TiN, TiW, Ti, Co, Ni, TaN, Ta, or other refractory metal, or combination thereof.

As shown in FIG. 2, the first and second fin structures F1 and F2 extend in the Y direction between a bottom side of the cell boundary CELB and a top side of the cell boundary CELB opposite to the bottom side. The third fin structure F3 extends in the Y direction from the bottom side of the cell boundary CELB and is shorter than the first and second fin structures. The fourth fin structure F4 extends in the Y direction from the top side of the cell boundary CELB and is shorter than the first and second fin structures. The first and second dummy fin structures DF1 and DF2 are shorter than the third and fourth fin structures, and have a length of about 20% to about 40% of the length of the left/right sides of the cell boundary.

The SRAM unit cell further includes third to eighth contact bars CB3-CB8. The third contact bar CB3 connects a drain of the FinFET PG1 and a drain of the Fin FET PD1 to a drain of the Fin FET PU1, and electrically connected to the word line. The fourth contact bar CB4 connects a drain of the FinFET PG2 and a drain of the Fin FET PD2 to a drain of the Fin FET PU2, and electrically connected to the word line. The fifth contact bar CB5 is disposed over a source of the Fin FET PG1, and electrically connected to a bit line. The sixth contact bar CB6 is disposed over a source of the Fin FET PU1, and electrically connected to a second power supply line, for example, Vdd. The seventh contact bar CB7 is disposed over a source of the Fin FET PU2, and electrically connected to the second power supply line. The eighth contact bar CB8 is disposed over a source of the Fin FET PG2, and electrically connected to a complementary bit line.

Figure 3:
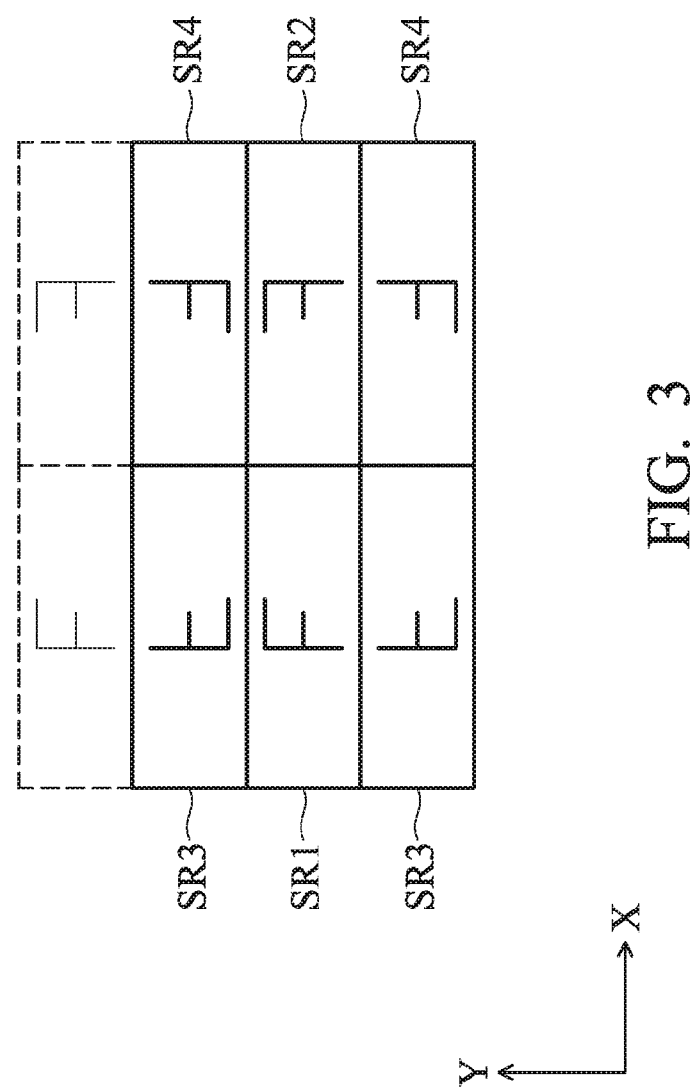
FIG. 3 is an exemplary arrangement of plural SRAM unit cells.

The SRAM includes a plurality of SRAM unit cells arranged in the X (row) and Y (column) directions. FIG. 3 shows an exemplary layout of four SRAM unit cells, first to fourth SRAM unit cells, SR1, SR2, SR3 and SR4. The first SRAM SR1 has, for example, the layout structures shown by FIG. 2. The second SRAM SR2 has a layout which is a horizontally flipped layout of the first SRAM SR1 with respect to an axis parallel to the Y direction. The third SRAM SR3 has a layout which is a vertically flipped layout of the first SRAM SR1 with respect to an axis parallel to the X direction. The fourth SRAM SR4 has a layout which is a horizontally flipped layout of the third SRAM SR3 with respect to an axis parallel to the Y direction. Along the column direction (Y), plural first SRAMs SR1 and plural third SRAMs SR3 are alternatively arranged.

Figure 4:
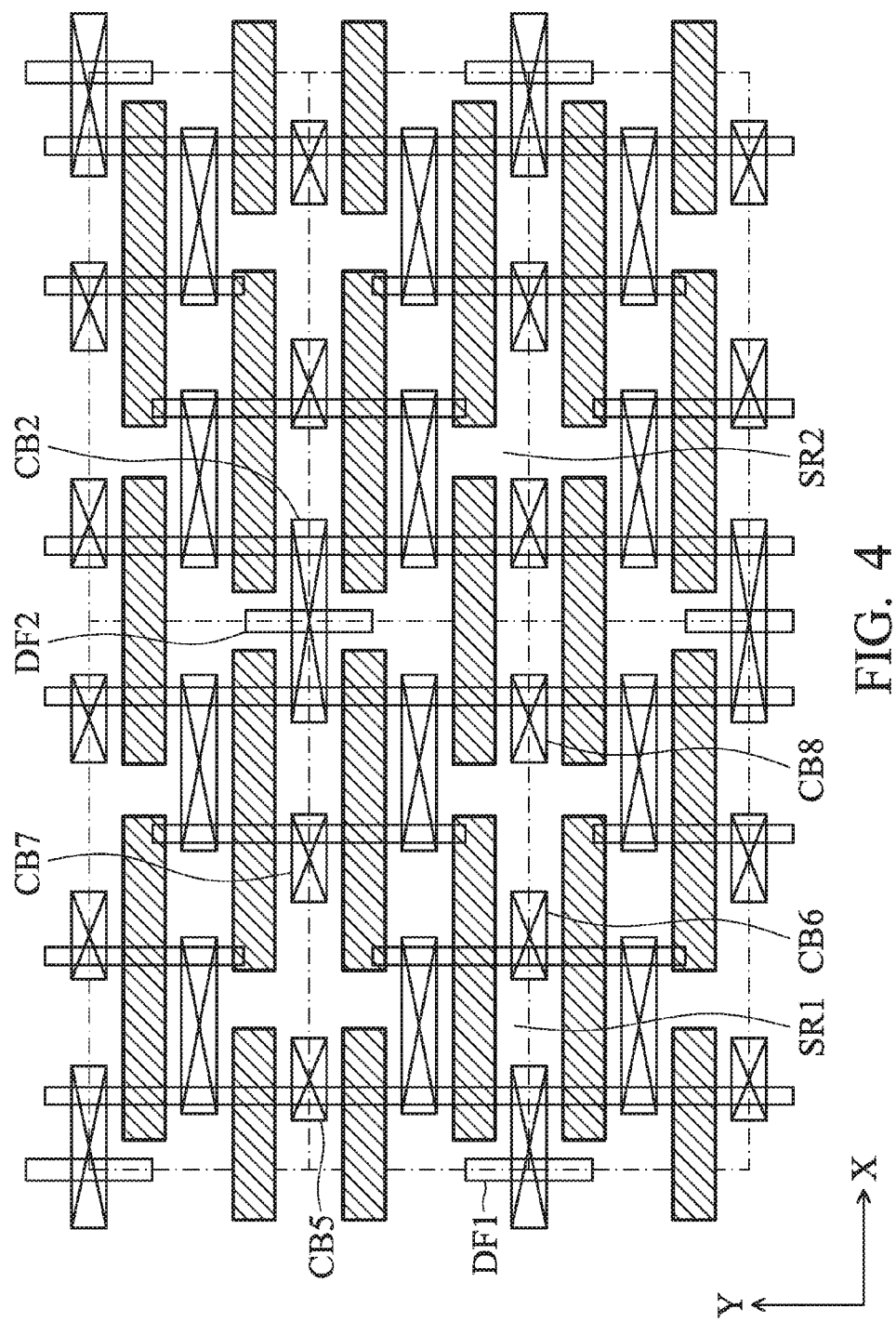
FIG. 4 is an exemplary arrangement of plural SRAM unit cells according to the first embodiment of the present disclosure.

FIG. 4 shows an SRAM array showing 2 rows and 3 columns. Each SRAM unit cell has the layout structure of FIG. 2 and its flipped structures as set forth above.

As shown in FIG. 4, the second dummy fin structure DF2 is located on a second side (right side) of the cell boundary CELB of SRAM unit cell SR1, which extends in the Y direction, and is shared by an adjacent SRAM unit cell SR2 in the X direction. Similarly, the first dummy fin structure DF1 is located on a first side (left side) of the cell boundary CELB of SRAM unit cell SR1, and is shared by an adjacent SRAM unit cell in the X direction. It can be said that the SRAM unit cell includes one half of the first dummy fin structure DF1 and one half of the second dummy fin structure DF2.

In the alternative, it can be said that one second (or first) dummy fin structure is disposed at corners where four adjacent SRAM unit cells SR1-SR4 gather, and shared by four adjacent SRAM unit cells SR1-SR4. Each of the SRAM unit cells includes one quarter of the shared dummy fin structure. Of course, if dummy fin structures (or other elements) are overlapped with each other when plural SRAM cell arranged in layout designing, the overlapped structures are formed as one structure in the actual device.

Similarly, the first and second contact bars CB1 and CB2 are disposed at corners where four adjacent SRAM unit cells SR1-SR4 gather, and are shared by four SRAM unit cells, and the fifth to eighth contact bars CB5-CB8 are shared by adjacent SRAM unit cells in the Y direction.

Figure 5A:
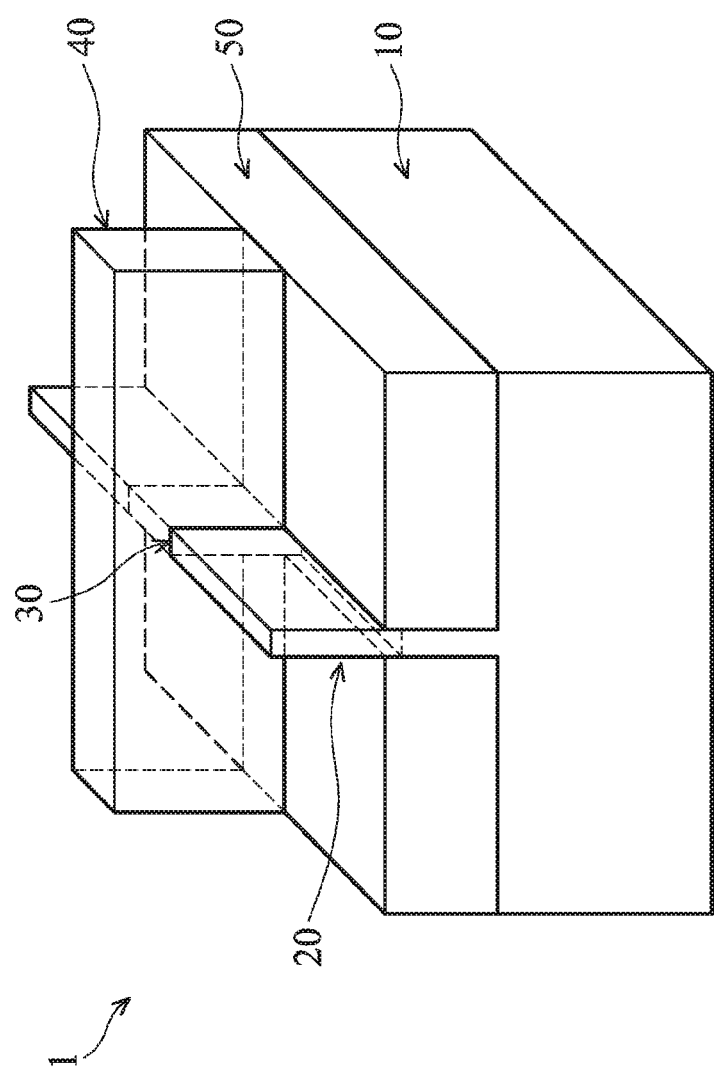
FIG. 5A shows an exemplary perspective view of a fin field effect transistor.

FIG. 5A shows an exemplary perspective view of a Fin FET. The Fin FET 1 includes, among other features, a substrate 10, a fin structure 20, a gate dielectric 30 and a gate electrode 40. In this embodiment, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The fin structure 20 is disposed over the substrate. The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The lower part of the fin structure 20 under the gate electrode 40 is referred to as a well region, and the upper part of the fin structure 20 is referred to as a channel region. Under the gate electrode 40, the well region is embedded in the isolation insulating layer 50, and the channel region protrudes from the isolation insulating layer 50. Spaces between the fin structures 20 and/or a space between one fin structure and another element formed over the substrate 10 are filled by an isolation insulating layer 50 (or so-called a "shallow-trench-isolation (STI)" layer) including an insulating material. The insulating material for the isolation insulating layer 50 may include silicon oxide, silicon nitride, silicon oxynitride (SiON), SiOCN, fluorine-doped silicate glass (FSG), or a low-k dielectric material.

The channel region protruding from the isolation insulating layer 50 is covered by a gate dielectric layer 30, and the gate dielectric layer 30 is further covered by a gate electrode 40. Part of the channel region not covered by the gate electrode 40 functions as a source and/or drain of the MOS FET.

In certain embodiments, the gate dielectric layer 30 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 40 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In some embodiments, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials. For the n-channel Fin FET, one or more of TaN, TaAlC, TiN, TiC, Co, TiAl, HfTi, TiSi and TaSi, or any other suitable materials, is used as the work function adjustment layer, and for the p-channel Fin FET, one or more of TiAlC, Al, TiAl, TaN, TaAlC, TiN, TiC and Co, or any other suitable materials, is used as the work function adjustment layer. The work function adjustment layer may be formed separately for the n-channel Fin FET and the p-channel Fin FET which may use different metal layers.

Source and drain regions are also formed in the fin structure 20 not covered by the gate electrode 40, by appropriately doping impurities in the source and drain regions or epitaxially growing appropriate material. An alloy of Si or Ge and a metal such as Co, Ni, W, Ti or Ta may be formed on the source and drain regions.

Figure 5B:
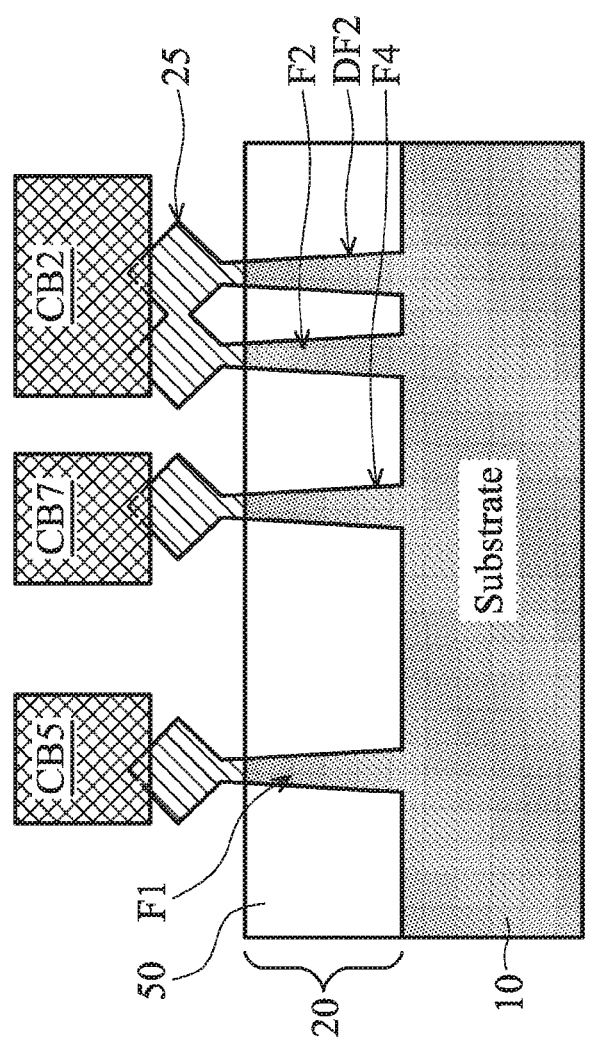
FIG. 5B shows an exemplary cross sectional view along line X1-X1 of FIG. 2.

FIG. 5B shows an exemplary cross sectional view along line X1-X1 of FIG. 2. An epitaxial S/D layer 25 is formed on each of the fin structures F1, F4 and F2 and the second dummy fin structure DF2. Further, the second contact bar CB2 is formed on the S/D layers of the second fin structure F2 and the second dummy fin structure DF2 to electrically connect the S/D layers. The fifth and seventh contact bars CB5 and CB7 are formed on the first fin structure F1 and the fourth fin structure F4, respectively.

Figure 5C:
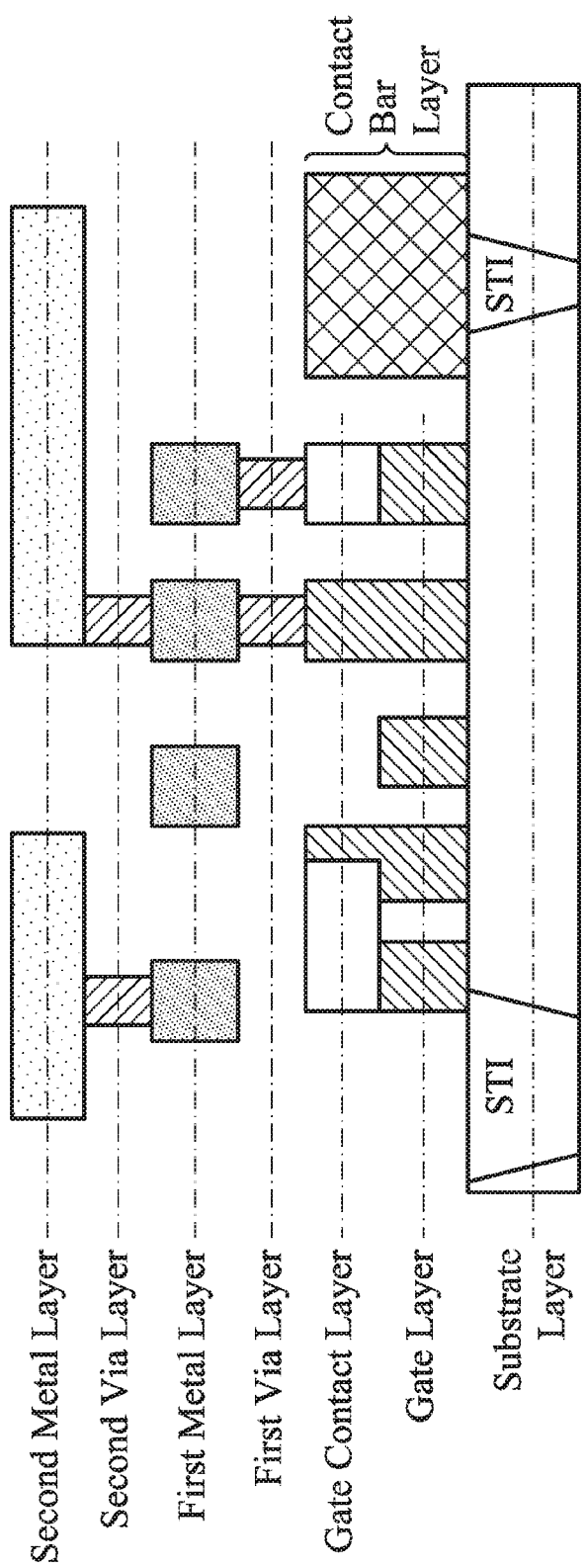
FIG. 5C is an exemplary cross sectional view illustrating vertical layers.

FIG. 5C shows an exemplary cross sectional view illustrating a vertical layer arrangement of the SRAM. FIG. 5C does not necessarily show a specific cross section of the SRAM unit cell described with FIGS. 2-4.

In the substrate layer the fin structures and source/drain structures are disposed. In the gate layer, gate structures including gate electrodes and gate dielectric layers are disposed. The gate contact layer is located above the gate layer. The contact bars are located in the contact bar layer extending from the gate layer to the gate contact layer. In the first via layer located over the gate contact layer and the contact bar layer, first vias are disposed. In the first metal layer, the first metal wirings are disposed. In the second via layer, the second vias are disposed. In the second metal layer level, second metal wirings are disposed.

Figure 6:
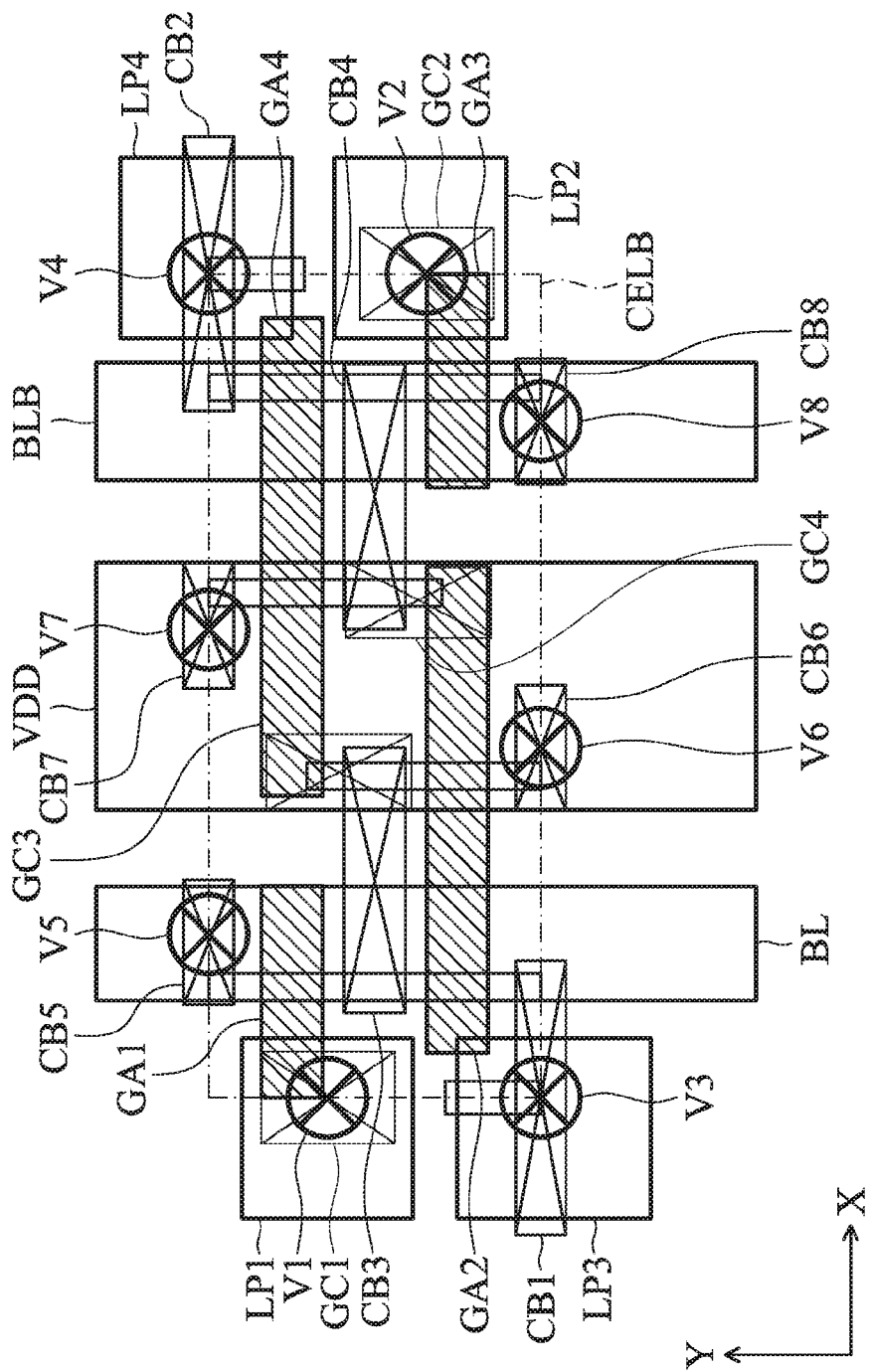
FIGS. 6-9 are exemplary layouts of an SRAM unit cell according to the first embodiment of the present disclosure.
Figure 7:
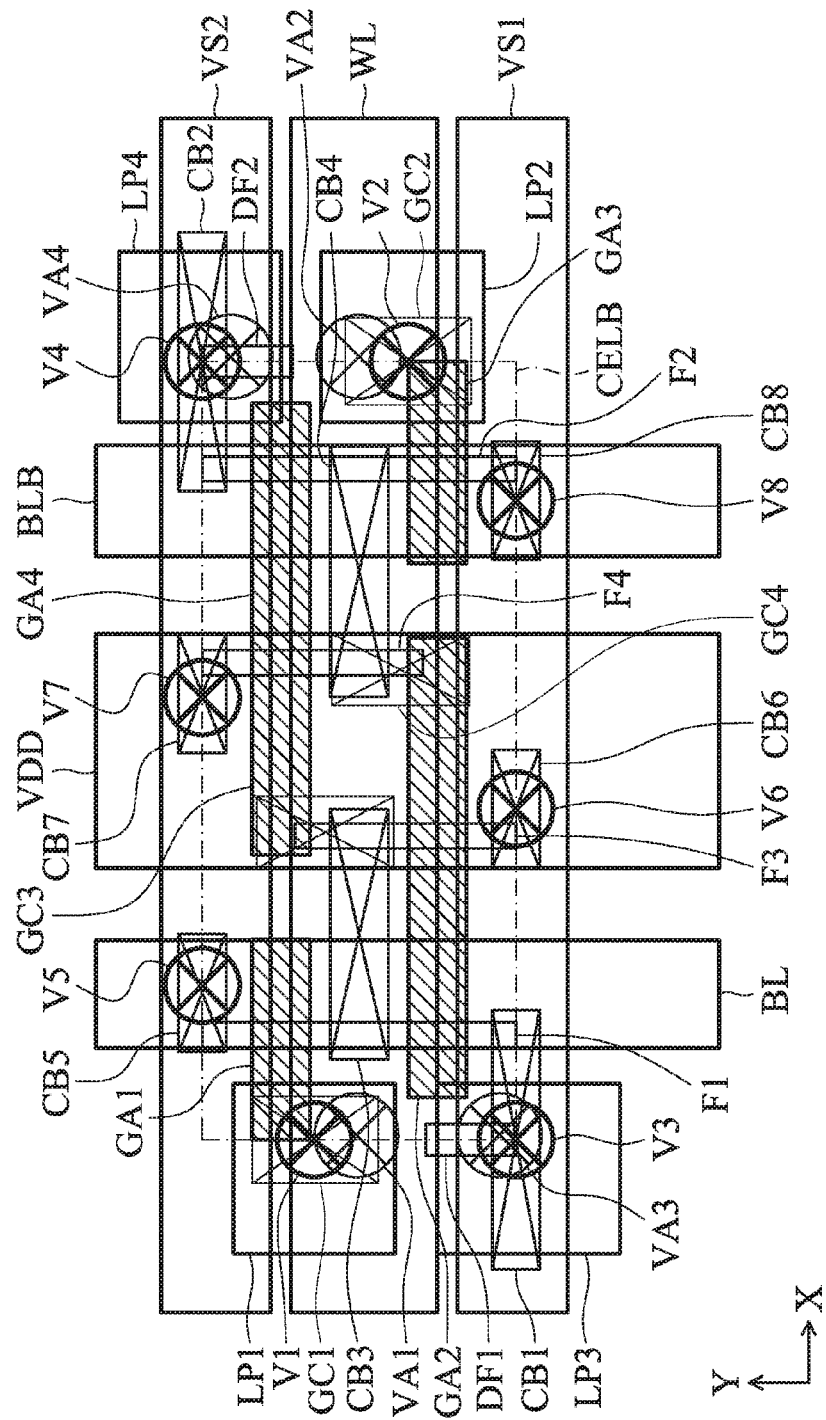

FIGS. 6 and 7 show an exemplary upper-layer layout of an SRAM unit cell according to the first embodiment of the present disclosure.

As shown in FIG. 6, the SRAM unit cell further includes first to fourth gate contacts GC1-GC4. The first gate contact GC1 is disposed on the first gate electrode GA1, and a second gate contact GC2 is disposed on the third gate electrode GA3. The third gate contact GC3 is disposed over the fourth gate electrode GA4 and the third contact bar CB3 and electrically connects the fourth gate electrode GC4 and the third contact bar CB3. The fourth gate contact GC4 is disposed over the third gate electrode GA3 and the fourth contact bar CB4 and electrically connects the third gate electrode GA3 and the fourth contact bar CB4. As shown in FIG. 6, the first and second gate contacts GC1 and GC2 are located on the cell boundary CELB and shared by adjacent SRAM unit cells.

The SRAM unit cell further includes first to eighth vias V1-V8. The first via V1 is disposed over the first gate contact GC1, and the second via V2 is disposed over the second gate contact GC2. The third via V3 is disposed over the first contact bar CB1, and the fourth via V4 is disposed over the second contact bar CB2. The fifth via V5 is disposed over the fifth contact bar CB5, the sixth via V6 is disposed over the sixth contact bar CB6, the seventh via V7 is disposed over the seventh contact bar CB7, and the eighth via V8 is disposed over the eighth contact bar CB8. As shown in FIG. 6, the vias V1-V8 are located on the cell boundary CELB and shared by adjacent SRAM unit cells. The vias V1-V8 are formed in the first via layer shown in FIG. 5C.

FIG. 6 also shows the bit line BL, the second power supply line VDD and the complementary bit line BLB, which extend in the Y direction over plural SRAM unit cells. The bit line BL is electrically connected to the source of the Fin FET PG1 (formed on the first fin structure F1) through the fifth via V5 and the fifth contact bar CB5, and the complementary bit line BLB is electrically connected to the source of the Fin FET PG2 (formed on the second fin structure F2) through the eighth via V8 and the eighth contact bar CB8. The second power supply line VDD is electrically connected to the source of the Fin FET PU1 (formed on the third fin structure F3) and the source of the Fin FET PU2 (formed on the fourth fin structure F4) through the sixth and seventh vias V6 and V7 and the sixth and seventh contact bars CB6 and CB7, respectively.

In addition, first to fourth local plates LP1-LP4 are provided. The first local plate LP1 is electrically connected to the first gate electrode through the first via V1 and the first gate contact GC1, and the second local plate LP2 is electrically connected to the third gate electrode GC3 through the second via V2 and the second gate contact GC2. The third local plate LP3 is electrically connected to the source of the Fin FET PD1 and the first dummy fin structure DF1 through the third via V3 and the first contact bar CB1, and the fourth local plate LP4 is electrically connected to the source of the Fin FET PD2 and the second dummy fin structure DF2 through the fourth via V4 and the second contact bar CB2. The bit line BL, the complementary bit line BLB, the second power supply line VDD and the first to fourth local plates are formed in the first metal layer shown in FIG. 5C.

FIG. 7 shows an exemplary upper-layer layout of an SRAM unit cell. A word line WL extending in the X direction is provided and is electrically connected to the first and second local plates LP1 and LP2 through a first upper via VA1 and a second upper via VA2. Two first power supply lines VS1 and VS2 extending in the X direction are also provided, and are connected to the third fourth local plates LP3 and LP4 through a third upper via VA3 and a fourth upper via VA4, respectively.

As shown in FIG. 7, the first and second upper vias VA1 and VA2 are located on the cell boundary CELB and shared by adjacent SRAM unit cells, and the third and fourth upper vias VA3 and VA4 are located at the corner of the cell boundary CELB, and are shared by four adjacent SRAM unit cells. The upper vias VA1-VA4 are formed in the second via layer and the word lines WL and the first power supply lines VS1 and VS2 are formed in the second metal layer, as shown in FIG. 5C.

The vias and metal layers are made of one or more layers of Cu, W, Al, AlCu, TiN, TiW, Ti, Co, Ni, TaN, Ta, or other refractory metal, or combination thereof.

Figure 8:
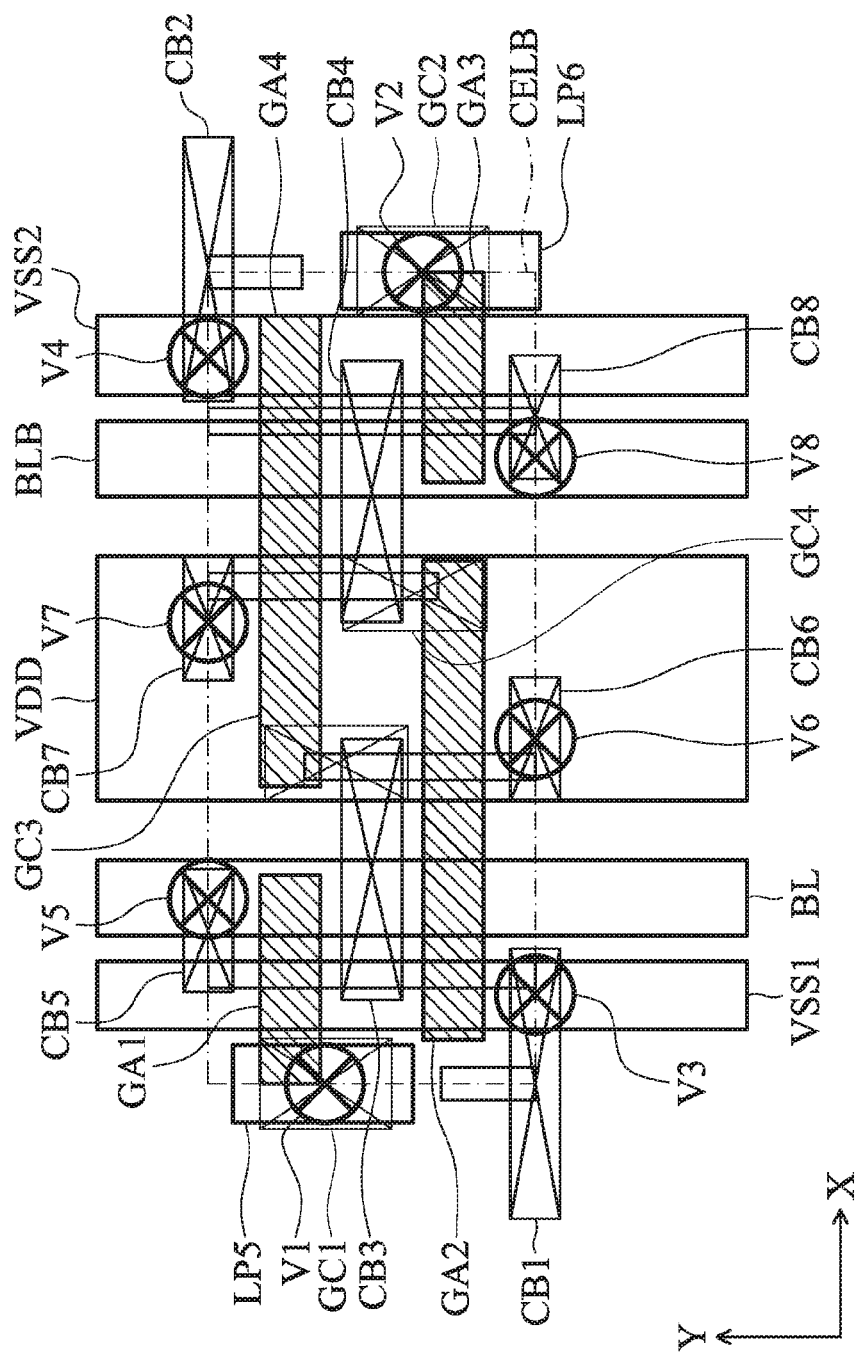
Figure 9:
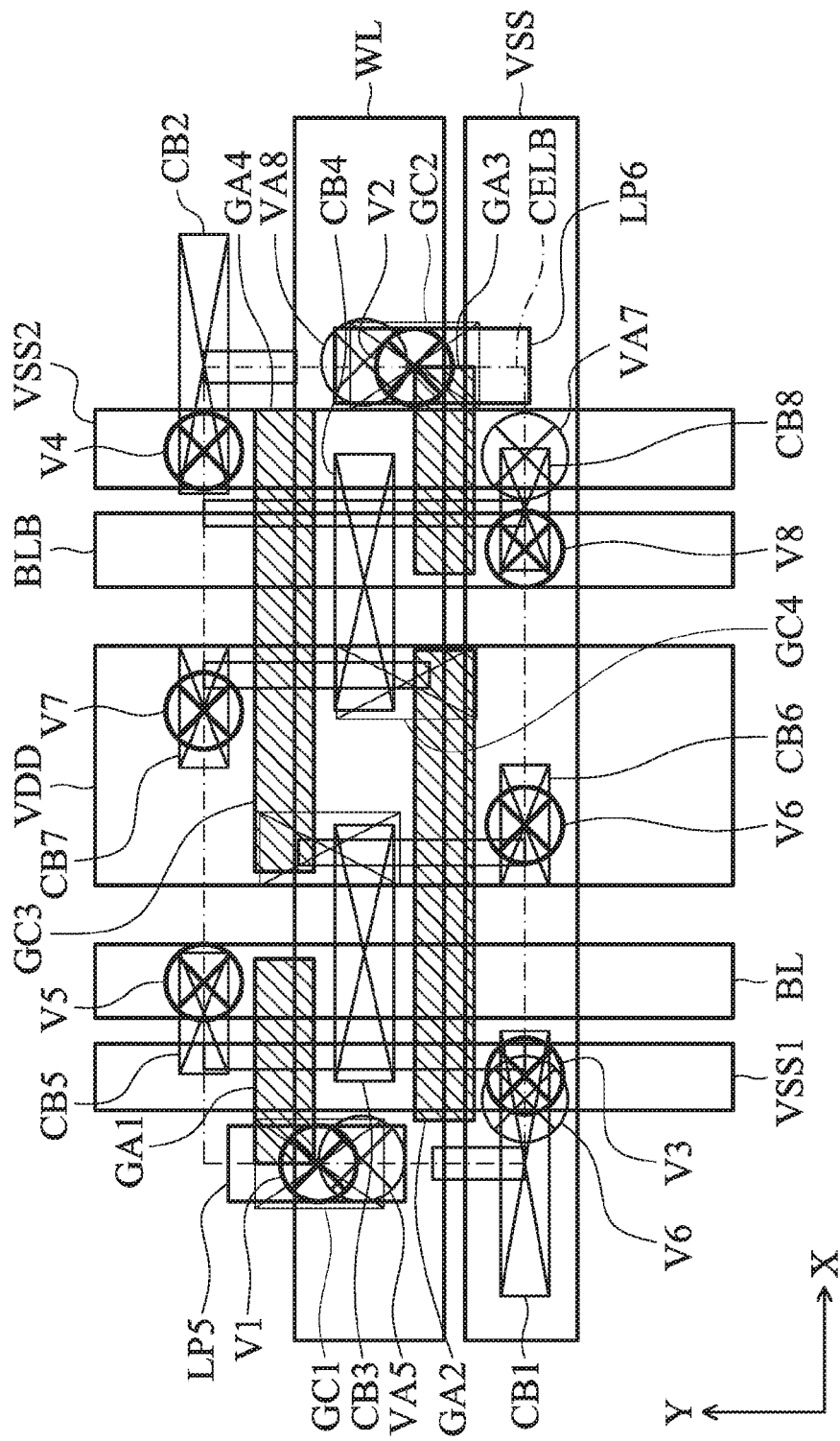

FIGS. 8 and 9 show another exemplary upper-layer layout of an SRAM unit cell according to the first embodiment of the present disclosure.

As shown in FIG. 8, the SRAM unit cell includes first to fourth gate contact GC1-GC4 and first to eighth vias V1-V8. The layout of the first to fourth gate contacts and the first to eighth vias is substantially the same as the layout shown in FIG. 6.

Similar to FIG. 6, the bit line BL, the second power supply line VDD and the complementary bit line BLB, which extend in the Y direction over plural SRAM unit cells. The bit line BL is electrically connected to the source of the Fin FET PG1 (formed on the first fin structure F1) through the fifth via V5 and the fifth contact bar CB5, and the complementary bit line BLB is electrically connected to the source of the Fin FET PG2 (formed on the second fin structure F2) through the eighth via V8 and the eighth contact bar CB8. The second power supply line VDD is electrically connected to the source of the Fin FET PU1 (formed on the third fin structure F3) and the source of the Fin FET PU2 (formed on the fourth fin structure F4) through the sixth and seventh vias V6 and V7 and the sixth and seventh contact bars CB6 and CB7, respectively.

Further, two lower first power supply lines VSS1 and VSS2, which extend in the Y direction over plural SRAM unit cells, are provided. One of the lower first power supply VSS1 is electrically connected to the source of the Fin FET PD1 and the first dummy fin structure DF1 through the third via V3 and the first contact bar CB1, and the other one of the lower first power supply VSS2 is electrically connected to the source of the Fin FET PD2 and the second dummy fin structure DF2 through the fourth via V4 and the second contact bar CB2.

Similar to FIG. 6, the first local plate LP1 is electrically connected to the first gate electrode through the first via V1 and the first gate contact GC1, and the second local plate LP2 is electrically connected to the third gate electrode GC3 through the second via V2 and the second gate contact GC2.

The bit line BL, the complementary bit line BLB, the second power supply line VDD, the lower first power supply line VSS1 and VSS2, and the first and second local plates are formed in the first metal layer shown in FIG. 5C.

In FIG. 9, a word line WL extending in the X direction is provided and is electrically connected to the first and second local plates LP1 and LP2 through a fifth upper via VA5 and a sixth upper via VA6. An upper first power supply line VSS extending in the X direction is also provided, and is connected to the lower first power supply lines VSS1 and VSS2 through a seventh upper via VA7 and a eighth upper via VA8, respectively.

As shown in FIG. 9, the upper vias VA5-VA8 are located on the cell boundary CELB and shared by adjacent SRAM unit cells. The upper vias VA5-VA8 are formed in the second via layer and the word lines WL and the upper first power supply line VSS is formed in the second metal layer, as shown in FIG. 5C.

Figure 10:
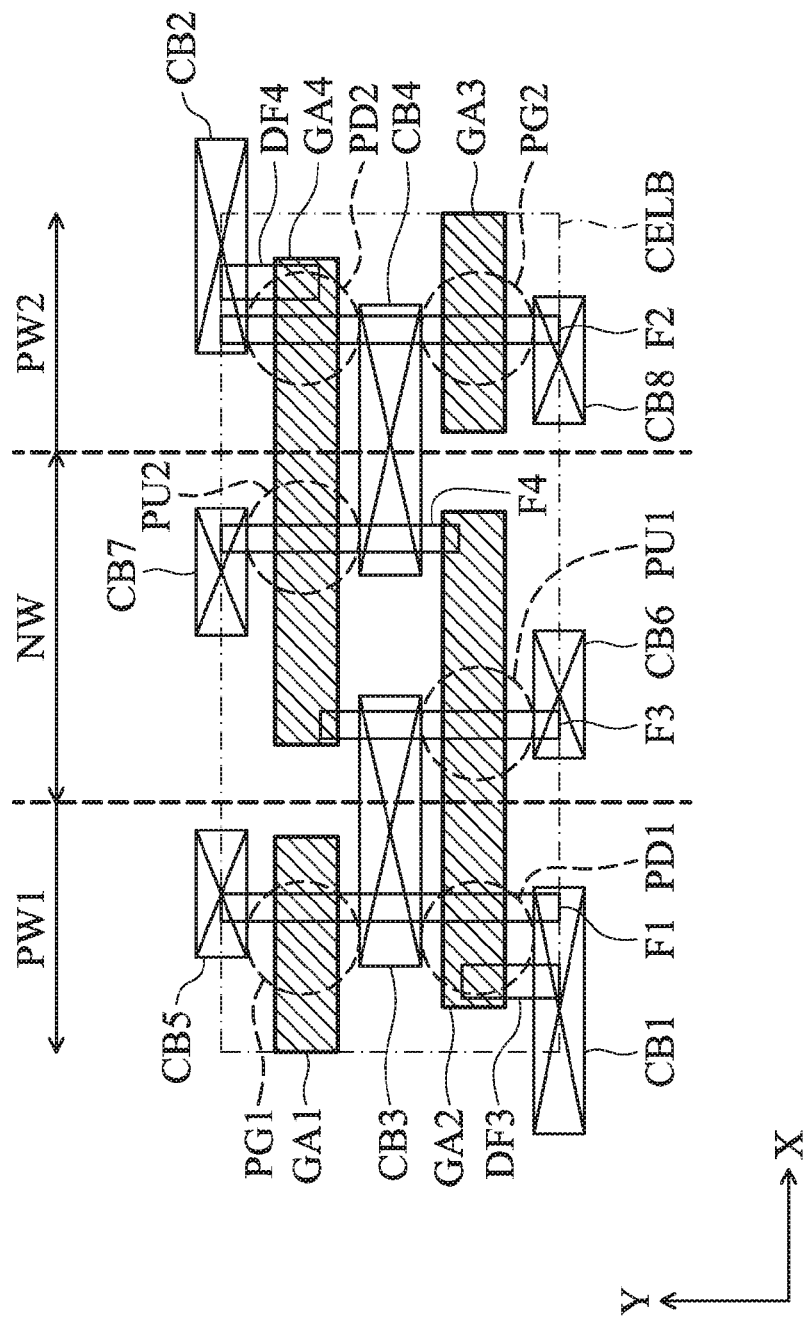
FIG. 10 is an exemplary layout of an SRAM unit cell according to the second embodiment of the present disclosure.

FIG. 10 is an exemplary layout of an SRAM unit cell according to the second embodiment of the present disclosure. The SRAM unit cell of the second embodiment has substantially the same arrangement as that of the first embodiment shown by FIG. 2, except for an arrangement of the dummy fin structures.

In the second embodiment, the third and fourth dummy fin structures DF3 and DF4 are located within the cell boundary CELB, as shown in FIG. 10. The locations of the first to fourth fin structures F1-F4 may be adjusted to maintain a space between adjacent fin structures which is required in a patterning operation.

Similar to the first embodiment, the third dummy fin structure DF3 is electrically connected to the source of the Fin FET PD1 by a first contact bar CB1. The source of the Fin FET PD1 includes a source/drain (S/D) epitaxial layer formed over the third fin structure, the dummy fin structure DF3 also includes an epitaxial layer formed over the third dummy fin structure DF3, and the first contact bar CB1 is formed over these epitaxial layers. The fourth dummy fin structure DF4 is electrically connected to the source of the Fin FET PD2 by a second contact bar CB2. The source of the Fin FET PD2 includes an S/D epitaxial layer formed over the second fin structure, the fourth dummy fin structure DF4 also includes an epitaxial layer formed over the fourth dummy fin structure DF4, and the second contact bar CB2 is formed over these epitaxial layers. The first and second contact bars CB1 and CB2 are electrically connected to a first power supply line, for example, Vss.

Figure 11:
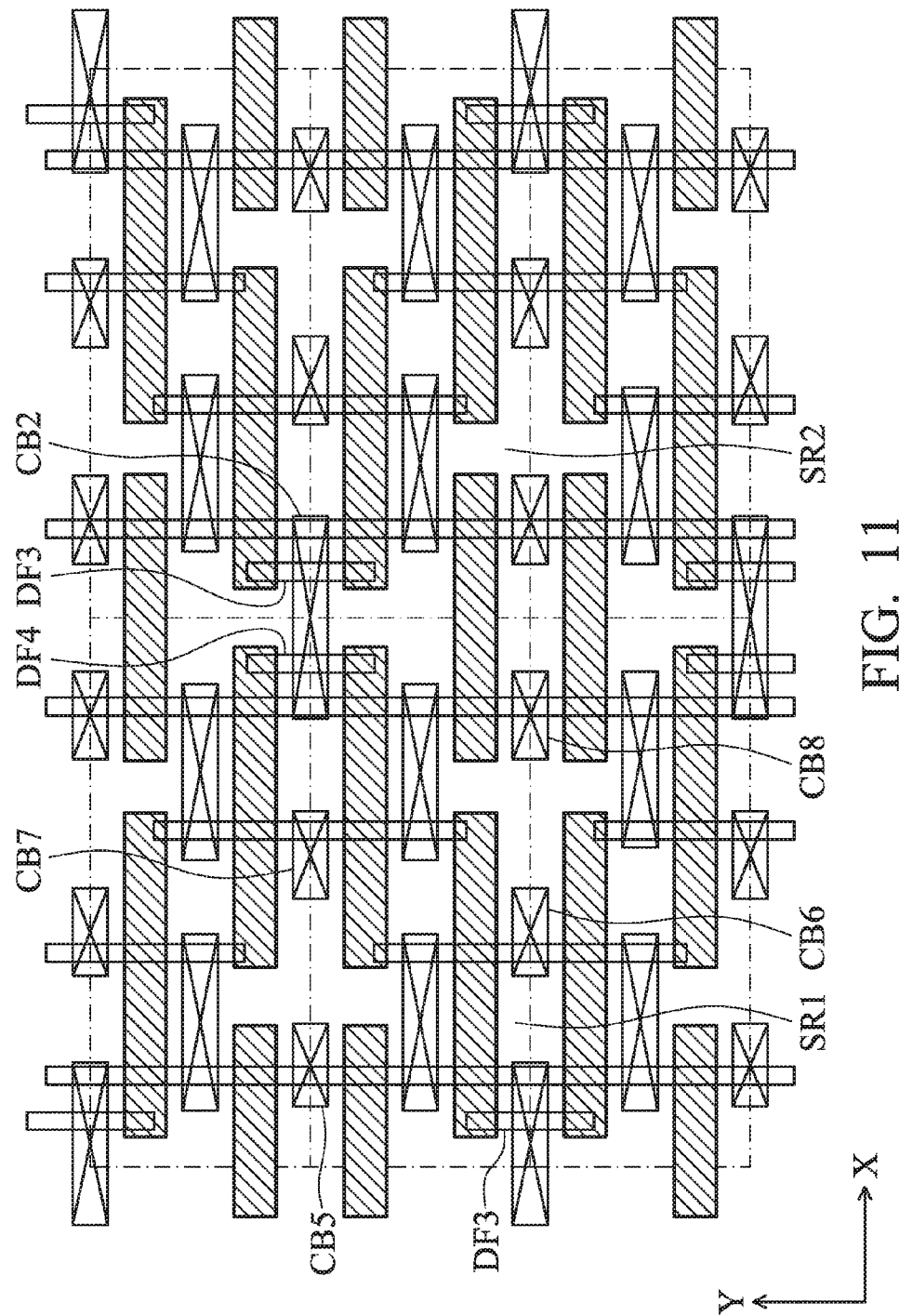
FIG. 11 is an exemplary arrangement of plural SRAM unit cells according to the second embodiment of the present disclosure.

FIG. 11 is an exemplary arrangement of plural SRAM unit cells according to the second embodiment of the present disclosure.

Similar to FIG. 4, since the third and fourth dummy fin structures are connected to the third and fourth dummy fin structures of the adjacent SRAM unit cells in the Y direction, one third dummy fin structure and one fourth dummy fin structure are provided for adjacent two SRAM unit cell, and each of the SRAM unit cells includes one half of the third dummy fin structure DF3 and one half of the fourth dummy fin structure DF4.

The upper layer layout of the SRAM according to the second embodiment is substantially the same as the upper layer layout of the SRAM according to the first embodiment shown by FIGS. 6-10.

The various embodiments or examples described herein offer several advantages over the existing art. For example, in the present disclosure, since the SRAM unit cell includes dummy fin structures adjacent to the Fin FET PD1 and PD2, it is possible to reduce contact resistance to the first power supply (Vss).

It will be understood that not all advantages have been necessarily discussed herein, no particular advantage is required for all embodiments or examples, and other embodiments or examples may offer different advantages.

In accordance with one aspect of the present disclosure, a static random access memory (SRAM) includes a plurality of SRAM unit cells. Each of the plurality of SRAM unit cells is defined by a cell boundary and comprises first, second, third and fourth fin structures extending in a first direction and arranged in a second direction crossing the first direction, and six fin field effect transistors. The first Fin FET is formed by a first gate electrode and the first fin structure, the second Fin FET is formed by a second gate electrode and the first fin structure, the third Fin FET is formed by the second gate electrode and the third fin structure, the fourth Fin FET is formed by a third gate electrode and the second fin structure, the fifth Fin FET is formed by a fourth gate electrode and the second fin structure, the sixth Fin FET is formed by the fourth gate electrode and the fourth fin structure. The SRAM unit cell further includes a first dummy fin structure located adjacent the second Fin FET, and connected by a first source/drain (S/D) epitaxial layer to the first fin structure, and a second dummy fin structure located adjacent to the fifth Fin FET, and connected by a second S/D epitaxial layer to the second fin structure.

In accordance with another aspect of the present disclosure, an SRAM includes a plurality of SRAM unit cells. Each of the plurality of SRAM unit cells being defined by a cell boundary and comprises first, second, third and fourth fin structures and six FETs. The first fin structure extends in a first direction between a bottom side of the cell boundary and a top side of the cell boundary opposite to the bottom side. The second fin structure extends in the first direction between the bottom side of the cell boundary and the top side of the cell boundary opposite to the bottom side. The third fin structure extends in the first direction from the bottom side, and is shorter than the first fin structure. The fourth fin structure extends in the first direction from the top side, and is shorter than the second fin structure. Each of the six FETs includes a gate electrode and only one of the first to fourth fin structures. The first to fourth fin structures are disposed in this order in a second direction crossing the first direction. Dummy fin structures extending in the first direction are disposed at corners where four adjacent SRAM unit cells gather, and the dummy fin structures are shared by the four adjacent SRAM unit cells. Each of the dummy fin structures is electrically connected to four first fin structures of the four adjacent SRAM unit cells or four second fin structures of the four adjacent SRAM unit cells.

In accordance with another aspect of the present disclosure, an SRAM includes a plurality of SRAM unit cells. Each of the plurality of SRAM unit cells is defined by a cell boundary and comprises first, second, third and fourth fin structures and six FETs. The first fin structure extends in a first direction between a bottom side of the cell boundary and a top side of the cell boundary opposite to the bottom side. The second fin structure extends in the first direction between the bottom side of the cell boundary and the top side of the cell boundary opposite to the bottom side. The third fin structure extends in the first direction from the bottom side, and is shorter than the first fin structure. The fourth fin structure extends in the first direction from the top side, and is shorter than the third fin structure. Each of the six FETs includes a gate electrode and only one of the first to fourth fin structures. The first to fourth fin structures are disposed in this order in a second direction crossing the first direction. First contact bars extending in the second direction are disposed at corners where four adjacent SRAM unit cells gather, and are shared by the four adjacent SRAM unit cells. Each of the first contact bars is disposed on four first fin structures of the four adjacent SRAM unit cells or on four second fin structures of the four adjacent SRAM unit cells.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) comprising a plurality of SRAM unit cells, each of the plurality of SRAM unit cells being defined by a cell boundary and comprising:
   first, second, third and fourth fin structures extending in a first direction and arranged in a second direction crossing the first direction;
   a first fin field effect transistor (Fin FET) formed by a first gate electrode and the first fin structure;
   a second Fin FET formed by a second gate electrode and the first fin structure;
   a third Fin FET formed by the second gate electrode and the third fin structure;
   a fourth Fin FET formed by a third gate electrode and the second fin structure;
   a fifth Fin FET formed by a fourth gate electrode and the second fin structure;
   a sixth Fin FET formed by the fourth gate electrode and the fourth fin structure;
   a first dummy fin structure located adjacent the second Fin FET, and connected by a first source/drain epitaxial layer to the first fin structure; and
   a second dummy fin structure located adjacent to the fifth Fin FET, and connected by a second S/D epitaxial layer to the second fin structure.

2. The SRAM according to claim 1, wherein the first dummy fin structure is located on a first side of the cell boundary, which extends in the first direction, and is shared by an adjacent SRAM unit cell in the second direction.

3. The SRAM according to claim 1, wherein the first dummy fin structure is located within the cell boundary and is shared by adjacent SRAM unit cells in the second direction.

4. The SRAM according to claim 1, wherein:
   the first and second fin structures extend in the first direction between a bottom side of the cell boundary and a top side of the cell boundary opposite to the bottom side,
   the third fin structure extends in the first direction from the bottom side and is shorter than the first fin structure,
   the fourth fin structure extends in the first direction from the top side and is shorter than the first fin structure, the first and second dummy fin structures are shorter than the third and fourth fin structures.

5. The SRAM according to claim 1, wherein:
the first S/D epitaxial layer is a source of the second Fin FET, and
the second S/D epitaxial layer is a source of the fifth Fin FET.

6. The SRAM according to claim 5, further comprising:
a first contact bar disposed over the first S/D epitaxial layer and electrically connected to a first power supply line; and
a second contact bar disposed over the second S/D epitaxial layer and electrically connected to the first power supply line, wherein:
the first contact bar is located on the cell boundary and is shared by adjacent SRAM unit cells in the first and second directions, and
the second contact bar is located on the cell boundary and is shared by adjacent SRAM unit cells in the first and second directions.

7. The SRAM according to claim 6, further comprising:
a third contact bar connecting a drain of the first FinFET and a drain of the second Fin FET to a drain of the third Fin FET, and electrically connected to a word line; and
a fourth contact bar connecting a drain of the fourth FinFET and a drain of the fifth Fin FET to a drain of the sixth Fin FET, and electrically connected to the word line.

8. The SRAM according to claim 7, further comprising:
a fifth contact bar disposed over a source of the first Fin FET, and electrically connected to a first bit line;
a sixth contact bar disposed over a source of the third Fin FET, and electrically connected to a second power supply line;
a seventh contact bar disposed over a source of the sixth Fin FET, and electrically connected to the second power supply line; and
an eighth contact bar disposed over a source of the fourth Fin FET, and electrically connected to a second bit line.

9. A static random access memory (SRAM) comprising a plurality of SRAM unit cells, each of the plurality of SRAM unit cells being defined by a cell boundary and comprising:
a first fin structure extending in a first direction between a bottom side of the cell boundary and a top side of the cell boundary opposite to the bottom side;
a second fin structure extending in the first direction between the bottom side of the cell boundary and the top side of the cell boundary opposite to the bottom side;
a third fin structure extending in the first direction from the bottom side, the third fin structure being shorter than the first fin structure;
a fourth fin structure extending in the first direction from the top side, the fourth fin structure being shorter than the second fin structure; and
six field effect transistors (FETs), each including a gate electrode and only one of the first to fourth fin structures, wherein:
the first to fourth fin structures are disposed in this order in a second direction crossing the first direction,
dummy fin structures extending in the first direction are disposed at corners where four adjacent SRAM unit cells gather, the dummy fin structures being shared by the four adjacent SRAM unit cells, and
each of the dummy fin structures is electrically connected to four first fin structures of the four adjacent SRAM unit cells or four second fin structures of the four adjacent SRAM unit cells.

10. The SRAM according to claim 9, further comprising:
first contact bars provided to and connected to the dummy fin structures with a one-to-one correspondence, and disposed at the corners where four adjacent SRAM unit cells gather, and being shared by the four adjacent SRAM unit cells.

11. The SRAM according to claim 9, wherein:
the adjacent four SRAM unit cells include:
a first SRAM unit cell;
a second SRAM unit cell that is a horizontally flipped cell of the first SRAM unit cell, and is adjacent to the first SRAM cell in the second direction;
a third SRAM unit cell that is a vertically flipped cell of the first SRAM unit cell, and is adjacent to the first SRAM unit cell in the first direction; and
a fourth SRAM unit cell that is a horizontally flipped cell of the third SRAM unit cell, and is adjacent to the third SRAM unit cell in the second direction and to the second SRAM unit cell in the first direction,
a dummy fin structure located at a corner where the first to fourth SRAM unit cells gather, and is connected to four second fin structures of the first to fourth SRAM unit cells.

12. The SRAM according to claim 11, further comprising:
a first contact bar connected to the dummy fin structure, and disposed at the corner where the first to fourth SRAM unit cells gather,
wherein the first contact bar is disposed over the four second fin structures of the first to fourth SRAM unit cells.

13. The SRAM according to claim 1, wherein the first contact bar is electrically connected to a first power supply line.

14. The SRAM according to claim 1, wherein the dummy fin structures are shorter than the third and fourth fin structures, in the first direction.

15. A static random access memory (SRAM) comprising a plurality of SRAM unit cells, each of the plurality of SRAM unit cells being defined by a cell boundary and comprising:
a first fin structure extending in a first direction between a bottom side of the cell boundary and a top side of the cell boundary opposite to the bottom side;
a second fin structure extending in the first direction between the bottom side of the cell boundary and the top side of the cell boundary opposite to the bottom side;
a third fin structure extending in the first direction from the bottom side, the third fin structure being shorter than the first fin structure;
a fourth fin structure extending in the first direction from the top side, the fourth fin structure being shorter than the third fin structure; and
six field effect transistors (FETs), each including a gate electrode and only one of the first to fourth fin structures, wherein:
the first to fourth fin structures are disposed in this order in a second direction crossing the first direction,
first contact bars extending in the second direction are disposed at corners where four adjacent SRAM unit cells gather, and being shared by the four adjacent SRAM unit cells, and each of the first contact bars is disposed on four first fin structures of the four adjacent SRAM unit cells or on four second fin structures of the four adjacent SRAM unit cells.

16. The SRAM according to claim 15, wherein:
each of the plurality of SRAM unit cells further comprises:
  a first dummy fin structure located between the first fin structure and a left side of the cell boundary, and electrically connected to the first fin structure; and
  a second dummy fin structure located between the second fin structure and a right side of the cell boundary, and electrically connected to the second fin structure.

17. The SRAM according to claim 16, wherein:
the adjacent four SRAM unit cells include:
  a first SRAM unit cell;
  a second SRAM unit cell that is a horizontally flipped cell of the first SRAM unit cell, and is adjacent to the first SRAM cell in the second direction;
  a third SRAM unit cell that is a vertically flipped cell of the first SRAM unit cell, and is adjacent to the first SRAM unit cell in the first direction; and
  a fourth SRAM unit cell that is a horizontally flipped cell of the third SRAM unit cell, and is adjacent to the third SRAM unit cell in the second direction and to the second SRAM unit cell in the first direction,
the second dummy fin structure of the first SRAM unit cell and the second dummy fin structure of the third SRAM unit cell form a first-continuous second dummy fin structure.

18. The SRAM according to claim 17, wherein:
the second dummy fin structure of the second SRAM unit cell and the second dummy fin structure of the fourth SRAM unit cell form a second-continuous second dummy fin structure.

19. The SRAM according to claim 18, wherein the first contact bar is electrically connected to the first-continuous second dummy fin structure and the second-continuous second dummy fin structure.

20. The SRAM according to claim 15, wherein the first contact bar is electrically connected to a first power supply line.

* * * * *